(12) United States Patent
Kwan et al.

(10) Patent No.: US 10,095,120 B2
(45) Date of Patent: Oct. 9, 2018

(54) VIBRATION-COMPENSATED OPTICAL SYSTEM, LITHOGRAPHY APPARATUS AND METHOD

(71) Applicant: Carl Zeiss SMT GmbH, Oberkochen (DE)

(72) Inventors: Yim-Bun Patrick Kwan, Oberkochen (DE); Tim Groothuijsen, Eindhoven (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/236,602

(22) Filed: Aug. 15, 2016

(65) Prior Publication Data
US 2016/0349623 A1    Dec. 1, 2016

Related U.S. Application Data

(63) Continuation of application No. PCT/EP2015/054769, filed on Mar. 6, 2015.

(30) Foreign Application Priority Data

Mar. 12, 2014  (DE) .......................... 10 2014 204 523

(51) Int. Cl.
   *G02B 27/58*       (2006.01)
   *G03F 7/20*        (2006.01)
   (Continued)

(52) U.S. Cl.
   CPC ............ *G03F 7/7015* (2013.01); *F16F 7/104* (2013.01); *F16F 15/022* (2013.01); *G02B 7/005* (2013.01); *G03F 7/709* (2013.01); *G03F 7/70825* (2013.01)

(58) Field of Classification Search
   CPC .......................... G03F 7/7015; G03F 7/70141
   (Continued)

(56) References Cited

U.S. PATENT DOCUMENTS

| 4,101,009 A | 7/1978 | Hehl et al. |
| 6,788,386 B2 * | 9/2004 | Cox ............. G03F 7/70141 355/52 |

(Continued)

FOREIGN PATENT DOCUMENTS

| DE | 2603689 | 8/1977 |
| DE | 10 2011 007 917 A1 | 10/2012 |

(Continued)

OTHER PUBLICATIONS

International Search Report and Written Opinion for corresponding PCT Appl No. PCT/EP2015/054769, dated Jun. 19, 2015.
(Continued)

*Primary Examiner* — Hung Henry Nguyen
(74) *Attorney, Agent, or Firm* — Fish & Richardson P.C.

(57) ABSTRACT

A vibration-compensated optical system for a lithography apparatus includes an optical element, a carrying element, an actuator for actuating the optical element relative to the carrying element, a first elastic element which directly couples the optical element to the carrying element, a reaction mass, and a second elastic element. The actuator couples the optical element to the reaction mass. The second elastic element directly couples the reaction mass to the carrying element. For a mass ($m_1$) of the optical element, a stiffness ($k_1$) of the first elastic element, a mass ($m_2$) of the reaction mass and a stiffness ($k_2$) of the second elastic element the following holds true:

(Continued)

$$\frac{m_1}{m_2} = \frac{k_1}{k_2}.$$

20 Claims, 5 Drawing Sheets

(51) Int. Cl.
    *F16F 15/02*     (2006.01)
    *F16F 7/104*     (2006.01)
    *G02B 7/00*     (2006.01)

(58) Field of Classification Search
    USPC .................................. 355/52, 53; 359/223
    See application file for complete search history.

(56) References Cited

U.S. PATENT DOCUMENTS

| | | |
|---|---|---|
| 2006/0017908 A1 | 1/2006 | Mayama |
| 2012/0105819 A1 | 5/2012 | Butler et al. |
| 2012/0140328 A1 | 6/2012 | Kwan |
| 2014/0043596 A1 | 2/2014 | Fischer et al. |
| 2014/0202812 A1 | 7/2014 | Hauf |

FOREIGN PATENT DOCUMENTS

| | | |
|---|---|---|
| DE | 10 2011 080 318 A1 | 2/2013 |
| EP | 0 557 100 A1 | 8/1993 |
| EP | 1 321 822 A1 | 6/2003 |
| EP | 1 321 823 A2 | 6/2003 |
| EP | 2 447 777 A2 | 5/2012 |
| JP | S 5294988 A | 8/1977 |
| JP | 2002040355 A | 2/2002 |
| JP | 2003-203860 A | 7/2003 |
| JP | 2011247314 A | 12/2011 |
| JP | 2013029137 A | 2/2013 |
| TW | 201219998 | 5/2012 |

OTHER PUBLICATIONS

Japanese Office Action, with translation thereof, for corresponding JP Appl No. 2016-556819, dated Oct. 3, 2017.
Korean Office Action, with translation thereof, for corresponding Appl No. 10-2016-7027907, dated Feb. 1, 2018.
German Office Action, with translation thereof, for corresponding Appl No. 10 2014 204 523.1, dated Dec. 11, 2014.

* cited by examiner

VIBRATION-COMPENSATED OPTICAL SYSTEM, LITHOGRAPHY APPARATUS AND METHOD

CROSS-REFERENCE TO RELATED APPLICATIONS

The present application is a continuation of, and claims benefit under 35 USC 120 to, international application PCT/EP2015/054769, filed Mar. 6, 2015, which claims benefit under 35 USC 119 of German Application No. 10 2014 204 523.1, filed Mar. 12, 2014. The entire disclosure of international application PCT/EP2015/054769 and German Application No. 10 2014 204 523.1 are incorporated by reference herein.

FIELD

The disclosure relates to a vibration-compensated optical system, a lithography apparatus and a method.

BACKGROUND

Lithography apparatuses are used for example in the production of integrated circuits or ICs in order to image a mask pattern in a mask onto a substrate, such as e.g. a silicon wafer. In this case, the mask generates a circuit pattern corresponding to a respective layer of the IC. This pattern is imaged onto a target region of the silicon wafer that is coated with a photoresist. In general, a single silicon wafer includes a multiplicity of target regions adjoining one another, which are gradually exposed. In this respect, a distinction is drawn between two types of lithography apparatuses. In the case of the first type, the target region is exposed by the entire mask being exposed in one step. This type of apparatus is usually designated as "stepper". A second type of lithography apparatus—usually designated as "step-and-scan" apparatus—provides for each target region to be illuminated by the mask being progressively scanned with a light beam. Synchronously therewith, the substrate is scanned by the light beam.

In order to enable very dense and small structures to be produced, so-called multiple patterning methods have been disclosed. These include double patterning or quadruple patterning, for example. In this case, difference sequences of exposure and etching steps are used in order to be able to produce particularly small patterns on substrates, which otherwise could no longer be imaged sufficiently sharply.

A further step towards sharper imaging during photolithographic patterning is so-called immersion lithography. In the latter, air in the gap between the last lens element and the wafer surface is replaced by an immersion liquid having the highest possible refractive index. This technique allows structures of minimally 28 nm to be manufactured in industrial mass production using existing lithography systems on the basis of ArF excimer lasers (also called 193-nanometer lithography).

Yet another step in the development of improved lithography apparatuses is so-called EUV lithography, which makes use of electromagnetic radiation having a wavelength of 13.5 nm (also referred to as extreme ultraviolet radiation).

What is common to the lithography apparatuses described above is that the optical systems and elements have to be positioned highly accurately, in particular in order to minimize or avoid image distortions, unsharpnesses and an overlap offset during the imaging of the mask pattern on the substrate. This aspect is accorded a prominent importance precisely in the field of the 10 nm-technology node.

In this case, the positioning can include the positioning of optical and non-optical elements in up to six degrees of freedom (that is to say, for example, translationally along the three orthogonal axes and rotationally in each case about the same). The positioning can be adversely influenced by vibrations and the like. Such vibrations can arise for example outside the lithography apparatus, such as, for example, as a result of sound, vibrations of the foundations or the like, or within the lithography apparatus, such as, for example, as a result of reaction forces upon the actuation of, in particular, optical elements. External disturbing forces on the lens element or the lens, which typically weighs more than one ton, can vary in the range of 0.1 N or even just 0.05 N, for example. The reaction forces that arise during a dynamic correction, in particular in real time, are much greater by comparison therewith. Despite the use of light materials and corresponding lightweight construction techniques, the forces used here are up to 10 N per degree of freedom, for example. Forces of 50 N, for example, can thus arise in total, such that force suppression by a factor of 1000 may be used.

By way of example, EP 1 321 823 A2 discloses in its FIG. 3 a mirror 10, which is held relative to a system frame 11 (also referred to as "lens barrel") by gravitational force compensation springs 12. An actuation for altering the position of the mirror 10 is carried out via actuators 15, for example Lorentz force motors, which are supported on the system frame 11 via a reaction mass 14 and a spring 16. Upon an actuation of the mirror 10 via the actuator 15, the reaction mass 14 reduces the reaction forces of the actuator 15 that are transmitted to the system frame 11. The natural frequency of the reaction mass 14 and assigned spring 16 is in this case typically 10 Hz, and that of the mirror 10 and of assigned gravitational force compensation springs 12 is typically significantly less than 1 Hz.

SUMMARY

The present disclosure seeks to provide an improved vibration-compensated optical system, an improved lithography apparatus and also an improved method for producing a vibration-compensated optical system.

In one aspect, the disclosure provides a vibration-compensated optical system for a lithography apparatus, including an optical element, a carrying element and an actuator for actuating the optical element relative to the carrying element. Furthermore, the system includes a first elastic element, which couples, in particular directly, the optical element to the carrying element, a reaction mass, wherein the actuator couples the optical element to the reaction mass, and a second elastic element, which couples, in particular directly, the reaction mass to the carrying element. For a mass of the optical element, a stiffness of the first elastic element, a mass of the reaction mass and a stiffness of the second elastic element the following holds true:

$$\frac{m_1}{m_2} = \frac{k_1}{k_2}.$$

The reaction mass generally takes up a large portion of the reaction force that results from the actuation of the optical element and that acts on the reaction mass. Nevertheless, provision is made for supporting the reaction mass on the carrying element via the second elastic element. The second elastic element is designed, in particular, to move the reaction mass back into its starting position. This is desirable particularly if the position of the reaction mass is not controlled (in the sense of closed-loop control). Via the second elastic element, forces are then transmitted to the carrying element, particularly if the optical element is actuated. In order to minimize these forces, generally, as also described in EP 1 321 823 A2, soft springs are used, such that a ratio of the mass of the reaction mass to the stiffness of the second elastic element typically results such that the natural frequency of this single-mass vibrator is between 5 and 10 Hz, for example. For specific applications, however, even with the second elastic element having a stiffness chosen in such a way, the forces introduced into the carrying element are too great. The stiffness of the second elastic element should accordingly be reduced further. However, it has been found that this is not practicable, both from a production engineering standpoint and in view of the large space taken up by such very soft elastic elements. The inventors therefore surprisingly arrived at the solution of coordinating the masses of the optical element and of the reaction mass and also the stiffnesses of the first and second elastic elements with one another in such a way that the supporting forces of the first and second elastic elements during operation, that is to say upon an actuation of the optical element, cancel one another out. This is the case if the following holds true:

$$\frac{m_1}{m_2} = \frac{k_1}{k_2}.$$

In the present case, the equals sign "=" should be understood to mean that the ratio $m_1/m_2$ substantially corresponds to the ratio $k_1/k_2$. By way of example, the ratio, expressed below in the ratio formula:

$$\frac{m_1 k_2}{m_2 k_1}$$

is between 0.8 and 1.2, preferably between 0.9 and 1.1, more preferably between 0.95 and 1.05, even more preferably between 0.99 and 1.01 and even more preferably between 0.999 and 1.001. In the case where the damping is disregarded, the resulting force on the carrying element thus turns out to be substantially equal to zero, as will be derived in even greater detail at a later juncture.

Accordingly, in the case of the present solution, it is no longer of importance for the stiffness of the second elastic element to be as low as possible. Preferably, therefore—which is advantageous both from a production engineering standpoint and in view of the structural space for the second elastic element—the following can hold true:

$$\frac{\sqrt{\frac{k_1}{m_1}}}{2\pi} = \frac{\sqrt{\frac{k_2}{m_2}}}{2\pi} \geq 5 \text{ Hz}.$$

Instead of ≥5 Hz, the following can also hold true: ≥10 Hz or ≥20 Hz. In other words, the ratio of $k_1$ to $m_1$ and of $k_2$ to $m_2 \geq 1000$ s^-2, ≥3950 s^-2 or 15791 s^-2.

The present principle of force compensation can be extended without any problems to all six degrees of freedom (three translational along respective orthogonal axes and three rotational about a respective orthogonal axis). In this case, the equations mentioned here are correspondingly applicable, wherein the corresponding inertia, stiffness and damping matrices should be employed with regard to the masses, stiffnesses and dampings. The carrying element can be for example a system frame, a lens or a lens barrel; however, further carrying elements are also conceivable.

"Coupling" in the present case means any force-locking, positively locking and/or cohesive connection. The coupling is therefore designed to be suitable for force transmission.

"Coupling directly" means a mechanical connection without the interposition of further components.

Instead of the components respectively described as individual elements (e.g. reaction mass or first/second elastic element), it is also possible to provide a plurality of elements, that is to say for example two or three reaction masses instead of only one reaction mass.

The actuation of the optical element relative to the carrying element includes changing the position of the optical element. The change of position can be carried out in this case in at least one of, for example, six degrees of freedom (three translational along respective orthogonal axes and three rotational about a respective orthogonal axis). The actuation can take place in particular for dynamic correction in particular in real time during an exposure process in which the optical element, for example, participates.

In accordance with one embodiment, the system furthermore includes a first damping element, which couples the optical element to the carrying element and a second damping element, which couples the reaction mass to the carrying element. For the mass of the optical element, the stiffness of the first elastic element, the damping of the first damping element, the mass of the reaction mass, the stiffness of the second elastic element and the damping of the second damping elements the following holds true:

$$\frac{m_1}{m_2} = \frac{k_1}{k_2} = \frac{c_1}{c_2}.$$

In this embodiment, then, the damping is also taken into account and chosen such that the resulting force on the carrying element is substantially equal to zero. Typically, separate first and second damping elements are not provided. Rather, the latter are integrated into the first and second elastic element, respectively. By way of example, a bending or torsion spring has both a stiffness and a damping. Regularly, the damping is of only very minor importance for the resulting force on the carrying element in relation to the chosen masses for the optical element or the reaction mass and in relation to the stiffnesses of the first and second elastic elements.

The resulting force acting on the carrying element thus results as the sum of a first and a second force. The first force is transmitted to the carrying element via the first elastic element. The second force is transmitted to the carrying element via the second elastic element. In the case where first and second damping elements are provided, a third and a fourth force arise, wherein the third force corresponds to the force transmitted to the carrying element by the first damping element and the fourth force corresponds to the force transmitted to the carrying element by the second damping element. The first and second forces, or the first, second, third and fourth forces are therefore provided via suitable setting of the masses, stiffnesses and/or damping in such a way that the force resulting from the actuation is equal to zero.

In accordance with a further embodiment, the first and/or second elastic element are/is embodied as bending or torsion spring. For this purpose, the first and/or second elastic element can be formed for example from metal or semi-metal, in particular silicon (this is advantageously free of hysteresis). By way of example, the first and/or second elastic element can, however, also be embodied as pneumatic spring (air spring) or hydraulic spring. By way of example, the ratio between the stiffness $k_x$ of the first and/or second elastic element in the actuation direction (that is to say in particular tension or compression) can be only a fraction of the lateral stiffness $k_y$, $k_z$ of the first and/or second elastic element (that is to say transversely with respect to the actuation direction). In this regard, by way of example, the ratio $k_y$ or $k_z$:$k_x$ can be between 100 and 500.

In accordance with a further embodiment, the first and/or second elastic element are/is formed from a monolithic material. In the case of such materials, the stiffness and/or damping thereof can advantageously be selected, determined and/or adapted very accurately.

In accordance with a further embodiment, the actuator is designed to generate oppositely oriented forces of identical magnitude that act on the optical element and the carrying element. The actuator therefore preferably exclusively generates a force-locking engagement between the optical element and the carrying element.

In accordance with a further embodiment, the actuator is designed to couple the optical element and the reaction mass to one another contactlessly. That is to say that there is no mechanical, direct connection between the optical element and the reaction mass. In particular, there is no mechanical connection between the magnet and the coil of a Lorentz force motor used as actuator. Accordingly, there is a complete dynamic decoupling between the optical element and the reaction mass.

In accordance with a further embodiment, the actuator is a Lorentz force motor. A "Lorentz force motor" should be understood to mean such a motor which generates a force on a different element by moving a charge in a magnetic or electric field. By way of example, the Lorentz force motor can include an electrical coil together with an assigned magnet.

In accordance with a further embodiment, the system furthermore includes a sensor for detecting a position of the optical element relative to the carrying element, and a control device designed to control the actuator depending on the detected position. The control device therefore performs a closed-loop control in this case. The control device can furthermore control the position of the optical element depending on parameters detected further sensors. The parameters can include for example a measured image distortion, a measured focus error and/or a measured overlay offset.

In accordance with a further embodiment, the reaction mass and/or the optical element are/is surface-processed for the purpose of adapting their/its mass and/or the first and/or second elastic element are/is surface-processed for the purpose of adapting their/its stiffness. As a result, the masses $m_1$, $m_2$ or stiffnesses $k_1$, $k_2$ can be set exactly, in a simple manner. In particular, it suffices to set either the stiffnesses (in particular even just one thereof) or the masses (in particular even just one thereof) in order to achieve the desired ratios. The mass of the reaction mass and/or of the optical element can be implemented for example with known metal processing processes, for example milling or grinding.

In accordance with a further embodiment, the surface processing is provided via etching or lasering. These methods are particularly suitable for removing defined masses. These methods can primarily be applied to the first and/or second elastic element, in particular in the embodiment as bending or torsion springs.

In accordance with a further embodiment, the optical element is a mirror and/or a lens element, in particular half of an Alvarez lens element. A mirror should be understood to mean in the present case generally reflective optical units, and a lens element should be understood to mean generally refractive optical units. The optical element can also be provided as a katadioptric system. Mirrors are particularly well suited to light having a very short wavelength. An Alvarez lens element is understood to mean two transmissive, refractive plates each including a planar surface and a contoured surface. The two contoured surfaces are embodied in such a way that they form the opposite of one another. Accordingly, induced phase differences cancel one another out if the two plates or two halves are arranged in such a way that the respective vertices thereof are arranged on the optical axis. If the two plates or halves are then displaced laterally relative to one another, a phase difference is induced which is equal to the differential of the surface profile of the contoured surface.

In accordance with a further embodiment, the mass of the optical element, the stiffness of the first elastic element, the damping of the first damping element, the mass of the reaction mass, the stiffness of the second elastic element and/or the damping of the second damping element are/is adaptable during operation. In particular, the stated parameters can preferably be altered in real time in particular during the exposure of the substrate. The first and second elastic elements and also the first and second damping elements can be passive mechanical elements. Alternatively, the passive mechanical elements can be replaced by an active suspension system. In the latter, closed-loop control of electromechanical actuations is carried out to the effect that the stiffnesses and/or dampings are simulated. The advantage of such an active system is that the stiffnesses and/or dampings can be altered via simple alteration of the control algorithm.

Furthermore, a vibration-compensated optical system for a lithography apparatus is proposed, including: an optical element, a carrying element, an actuator for actuating the optical element relative to the carrying element, a first elastic element, which couples, in particular directly, the optical element to the carrying element, a reaction mass, wherein the actuator couples the optical element to the reaction mass, and a second elastic element, which couples, in particular directly, the reaction mass to the carrying element, wherein a force on the carrying element, the force resulting from the actuation, is equal to zero.

"Equal to zero" should be understood to mean that the resulting force on the carrying element is negligibly small in relation to the reaction force resulting from the actuation of the optical element by the actuator. That is to say that the resulting force is of a magnitude such that it has no adverse consequences for the lithography method proceeding in the lithography apparatus. In particular, the ratio of the resulting force on the carrying element to the reflection force of the actuator is less than 1:10, preferably less than 1:100, and more preferably less than 1:1000.

In accordance with a further embodiment, the system furthermore includes a first damping element, which couples the optical element to the carrying element, or a second damping element, which couples the reaction mass to the carrying element. A mass of the optical element, a stiffness of the first elastic element, a damping of the first elastic element, a mass of the reaction mass, a stiffness of the second elastic element and a damping of the second elastic element are chosen in such a way that the force on the carrying element, the force resulting from the actuation, is equal to zero.

Advantageously, therefore, the parameters of mass, stiffness and damping are set in such a way that the force resulting from the actuation is equal to zero.

In accordance with a further embodiment, for the mass of the optical element, the stiffness of the first elastic element, the mass of the reaction mass and the stiffness of the second elastic element the following holds true:

$$\frac{m_1}{m_2} = \frac{k_1}{k_2}.$$

In accordance with a further embodiment, for the mass of the optical element, the stiffness of the first elastic element, the damping of the first damping element, the mass of the reaction mass, the stiffness of the second elastic element and the damping of the second damping element the following holds true:

$$\frac{m_1}{m_2} = \frac{k_1}{k_2} = \frac{c_1}{c_2}.$$

Furthermore, a lithography apparatus including a vibration-compensated optical system, as described above, is provided.

In accordance with a further embodiment, the actuator is designed to actuate the optical element during an exposure of a substrate. This can be carried out in real time, in particular. The exposure can be an exposure according to the "stepper" principle or the "step-and-scan" principle, as explained in the introduction.

In accordance with a further embodiment, the lithography apparatus furthermore includes a beam shaping system, an illumination system, a photomask and/or a projection system, wherein the beam shaping system, the illumination system, the photomask and/or the projection system include (s) the vibration-compensated optical system. A plurality of the vibration-compensated optical systems can also be provided.

Furthermore, a method for producing a vibration-compensated optical system for a lithography apparatus, in particular according to any of the preceding claims, is provided. The vibration-compensated optical system includes: an optical element, a carrying element, a first elastic element, which couples, in particular directly, the optical element to the carrying element, a reaction mass, an actuator for activating the optical element relative to the carrying element, wherein the actuator couples the optical element to the reaction mass, and a second elastic element, which couples, in particular directly, the reaction mass to the carrying element, wherein a mass of the optical element, a stiffness of the first elastic element, a mass of the reaction mass and/or a stiffness of the second elastic element are/is chosen in such a way that the following holds true:

$$\frac{m_1}{m_2} = \frac{k_1}{k_2}.$$

In other words, therefore, at least one of the stated parameters is adapted in such a way that the ratio described above is achieved. This then has the effect, in particular, that the force on the carrying element, the force resulting from the actuation, is substantially equal to zero.

In accordance with a further embodiment, the system furthermore includes a first damping element, which couples the optical element to the carrying element, and a second damping element, which couples the reaction mass to the carrying element, wherein the mass of the optical element, the stiffness of the first elastic element, the damping of the first damping element, the mass of the reaction mass, the stiffness of the second elastic element are chosen in such a way that the following holds true:

$$\frac{m_1}{m_2} = \frac{k_1}{k_2} = \frac{c_1}{c_2}.$$

Therefore, the damping can also be chosen such that the forces that act on the carrying element and result from the actuation cancel one another out.

In accordance with a further embodiment, firstly a damping of the first and/or second elastic damping element is determined, selected or adapted and according thereto the mass of the reaction mass and/or of the optical element and/or the stiffness of the first and/or second elastic element are/is adapted. Consequently, the masses and/or stiffnesses can be adapted to the damping, which can be implemented more simply in terms of method technology.

In accordance with a further embodiment, firstly three of four of the parameters selected from the group: mass of the optical element, stiffness of the first elastic element, stiffness of the second elastic element and mass of the reaction mass are selected or determined and depending thereon the fourth parameter is selected or adapted in such a way that the following holds true $$\frac{m_1}{m_2} = \frac{k_1}{k_2}.$$

As a result, the vibration-compensated optical system can be produced in a simple manner.

In accordance with a further embodiment, the fourth parameter is the mass of the reaction mass. The latter can be adapted in a particularly simple manner.

In accordance with a further embodiment, the reaction mass and/or the optical element are/is surface-processed for the purpose of adapting their/its mass and/or the first and/or second elastic element are/is surface-processed for the purpose of adapting their/its stiffness.

In accordance with a further embodiment, the surface processing includes etching or lasering.

Furthermore, a method for producing a vibration-compensated optical system for a lithography apparatus, in particular a vibration-compensated optical system as described above, is proposed, including: an optical element, a carrying element, a first elastic element, which couples, in particular directly, the optical element to the carrying element, a reaction mass, an actuator for actuating the optical element relative to the carrying element, wherein the actuator couples the optical element to the reaction mass, and a second elastic element, which couples, in particular directly, the reaction mass to the carrying element, wherein a mass of the optical element, a stiffness of the first elastic element, a mass of the reaction mass and/or a stiffness of the second elastic element are chosen in such a way that the force on the carrying element, the force resulting from the actuation, is equal to zero.

In accordance with a further embodiment, the system includes a first damping element, which couples the optical element to the carrying element, and a second damping element, which couples the reaction mass to the carrying element, wherein the mass of the optical element, the stiffness of the first elastic element, the damping of the first damping element, the mass of the reaction mass, the stiffness of the second elastic element and the damping of the second damping element are chosen in such a way that the force on the carrying element, the force resulting from the actuation, is equal to zero.

The features described in the present case for the vibration-compensated optical system are correspondingly applicable to the lithography apparatus and the method, and vice versa.

BRIEF DESCRIPTION OF THE DRAWINGS

Further exemplary embodiments will be explained with reference to the accompanying drawings, in which.

DETAILED DESCRIPTION OF EXEMPLARY EMBODIMENTS

Unless indicated otherwise, identical reference signs in the figures designate identical or functionally identical elements. Furthermore, it should be noted that the illustrations in the figures are not necessarily true to scale.

Figure 1:
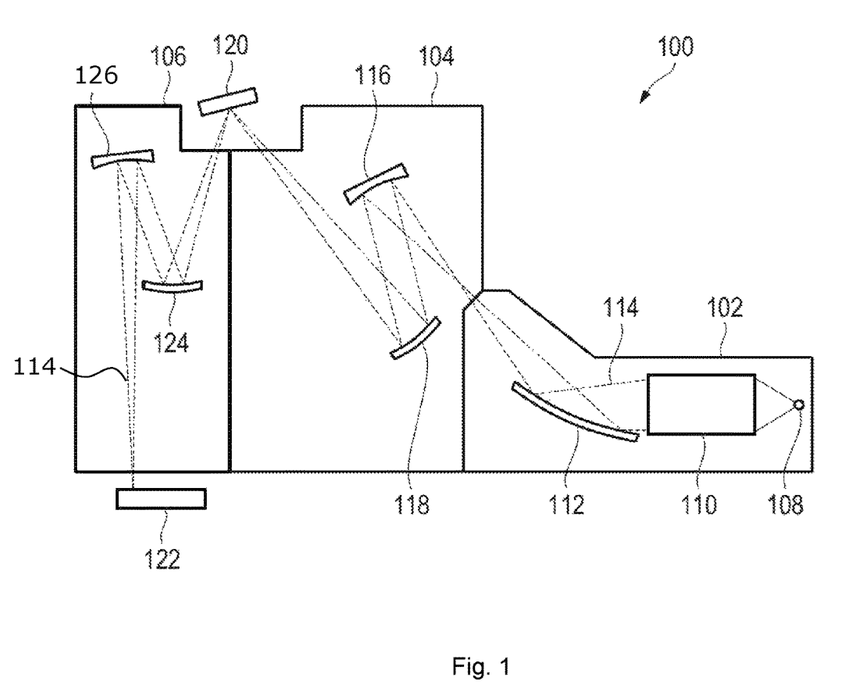
FIG. 1 shows a schematic view of a lithography apparatus in accordance with one embodiment.

FIG. 1 shows a schematic view of a lithography apparatus 100 in accordance with one embodiment, which includes a beam shaping system 102, an illumination system 104 and a projection system 106. The beam shaping system 102, the illumination system 104 and the projection system 106 are in each case provided in a vacuum housing which can be evacuated with the aid of an evacuation device (not illustrated in more specific detail). The vacuum housings are surrounded by a machine room (not illustrated in more specific detail) in which e.g. the drive devices for mechanically moving and/or setting the optical elements are provided. Furthermore, electrical controllers and the like can also be provided in the machine room.

The beam shaping system 102 includes a light source 108, a collimator 110 and a monochromator 112. By way of example, a plasma source or a synchrotron can be provided as the light source 108. The radiation emerging from the light source 108 is firstly focussed by the collimator 110, after which the desired operating wavelength is filtered out by the monochromator 112. The beam shaping system 102 thus adapts the wavelength and the spatial distribution of the light emitted by the light source 108. The radiation 114 generated by the light source 108 has a relatively low transmissivity through air, for which reason the beam guiding spaces in the beam shaping system 102, in the illumination system 104 and in the projection system 106 are evacuated.

In the example illustrated, the illumination system 104 includes a first mirror 116 and a second mirror 118. These mirrors 116, 118 can be combined for example as facet mirrors for pupil shaping and guide the radiation 114 onto a photomask 120.

The photomask 120 is likewise embodied as a reflective optical element and can be arranged outside the systems 102, 104, 106. The photomask 120 has a structure which is imaged onto a wafer 122 or the like in a reduced manner via the projection system 106. For this purpose, the projection system includes for example a third mirror 124 and a fourth mirror 126 in the beam guiding space 106. It should be noted that the number of mirrors of the lithography apparatus 100 is not restricted to the illustrated number, and it is also possible to provide more or fewer mirrors. Furthermore, the mirrors are generally curved at their front side for beam shaping purposes.

Figure 2:
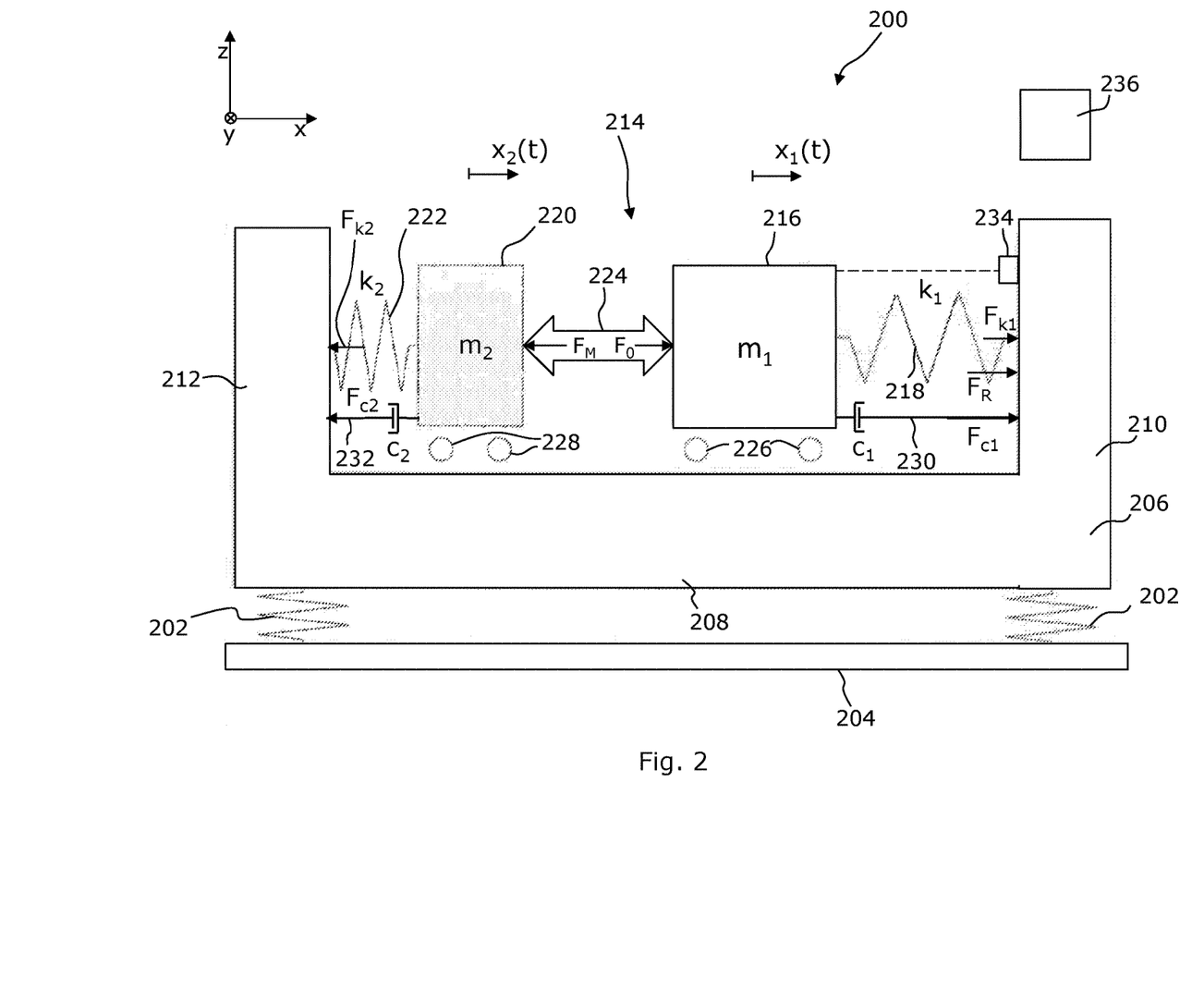
FIG. 2 schematically shows a first embodiment of a vibration-compensated optical system for the lithography apparatus from FIG. 1.
Figure 3:
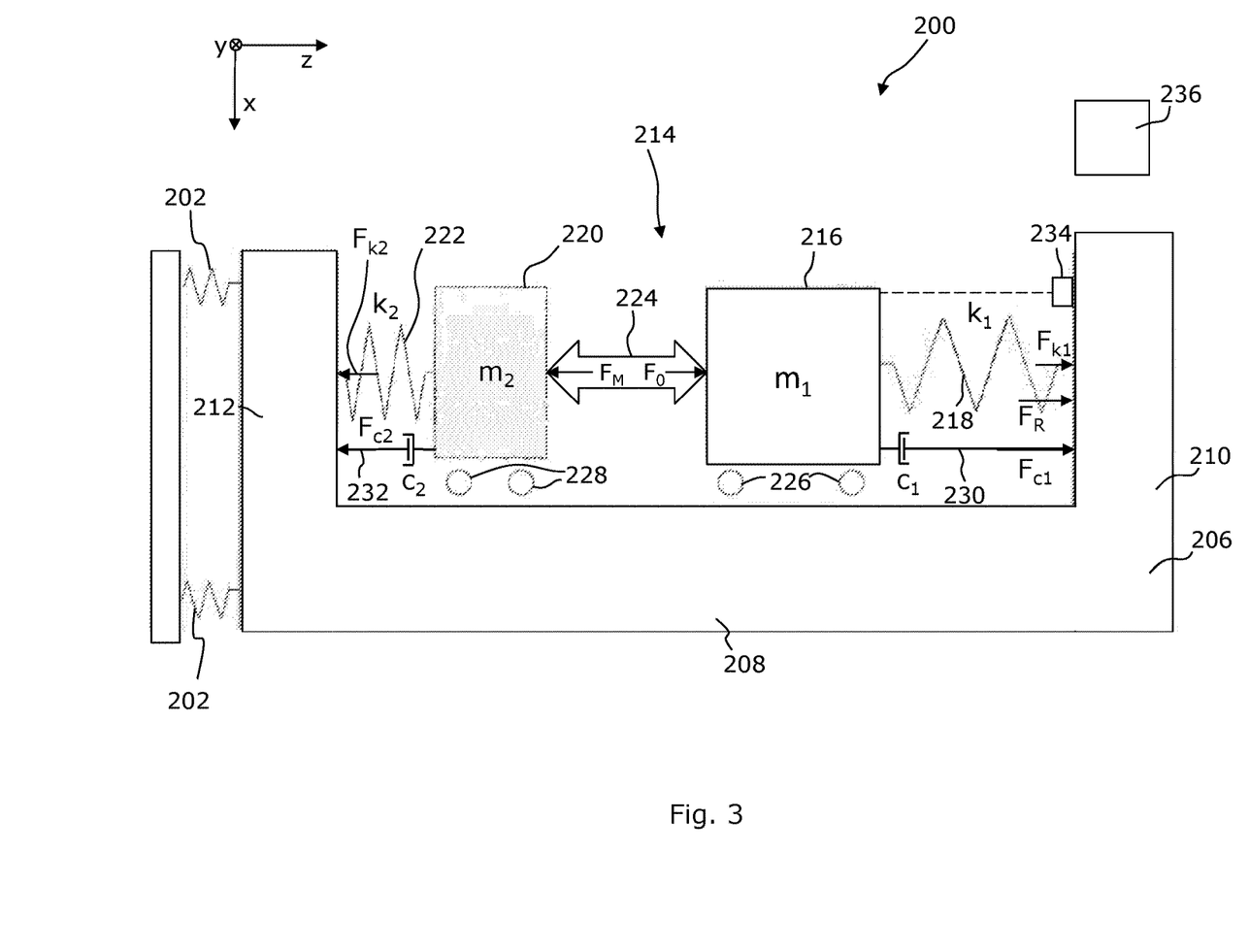
FIG. 3 shows a second embodiment of a vibration-compensated optical system for the lithography apparatus from FIG. 1.
Figure 4:
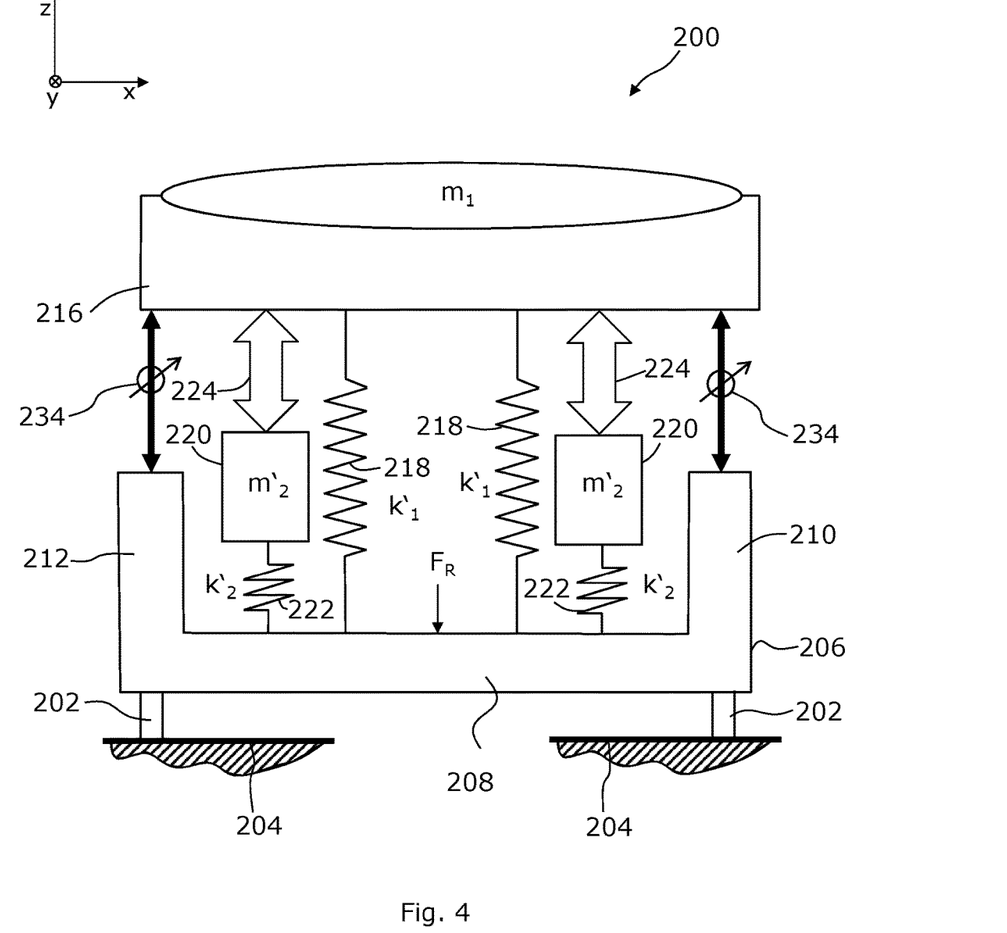
FIG. 4 shows a third embodiment of a vibration-compensated optical system for the lithography apparatus from FIG. 1.

One or a plurality of the vibration-compensated optical systems 200 shown in FIGS. 2-4 can be used in the lithography apparatus 100 shown in FIG. 1. By way of example, the beam shaping system 102, the illumination system 104, the projection system 106 or the photomask 120 can include one or a plurality of systems 200.

It should be emphasized at this juncture that FIG. 2 is an illustration purely of the fundamental principles.

As shown in FIG. 2, the vibration-compensated system 200 can be supported via elastic elements 202 on a system frame 204 of the lithography apparatus 100. The system frame 204 can be part of the projection system 106, for example. The system frame 204 can itself in turn be embodied in a manner vibration-insulated from a foundation on which the lithography apparatus 100 stands, and for this purpose can have correspondingly elastic elements by which it is supported on the foundation.

Opposite the system frame 204, the elastic elements 202, which can be embodied for example as bending or torsion springs, in particular composed of metal, or as air springs, are supported on an underside of a carrying elements 206. The carrying element 206 (also designated as "lens barrel") can be composed of, for example, one horizontal section 208 and two vertical sections 210, 212 adjacent to the horizontal section 208 vertically upwards. An optical element 216, a first elastic element 218, a reaction mass 220, a second elastic element 222 and an actuator 224 are arranged in the upwardly open pocket 214 thus formed.

The optical element 216 can be embodied for example as a mirror, lens or Alvarez plate. It can be accorded the function of directing the radiation 114 (see FIG. 1) onto the wafer 122 and/or correcting the radiation, for example reducing aberrations and/or improving the overlap accuracy. This is intended to take place in real time during the exposure of the wafer 122, in particular during the scanning thereof. The dynamic ranges with which the optical element 216 has to be positioned in the x-direction, for example, are correspondingly high. The direction x here denotes a horizontal. The z-direction corresponds to the vertical direction, and the y-direction corresponds to the direction respectively orthogonal to the x- and z-directions. Although explained below by way of example for one degree of freedom (in the x-direction), the principle described in the present case is equally applicable to the other five degrees of freedom (two translational degrees of freedom along the axes y, z and the respective rotational degrees of freedom about the axes x, y and z).

The mobility of the optical element 216 is realized via a bearing 226 indicated schematically. The mounting is preferably provided in a frictionless manner via aerostatic bearings, for example. The mounting is realized via an air cushion in this case.

The first elastic element 218 can be embodied for example as a bending or torsion spring in particular composed of monolithic material, for example silicon (this is advantageously free of hysteresis). Alternatively, the first elastic element 218 could also be embodied as an air spring. The first elastic element 218 connects the optical element 216, in particular directly (i.e. without interposition of further components between the optical element 216 and the carrying element 206, as shown in FIG. 2), to the carrying element 206, in particular to the vertical section 210.

The reaction mass 220 includes for example a coil of a Lorentz force motor forming the actuator 224. The corresponding magnet of the Lorentz force motor or actuator 224 is for example fitted on the optical element 216 or integrated into the latter. The coil and the magnet of the actuator 224 can be connected to one another via a contactless force-locking engagement; there is no mechanical connection between them at any time. Thus, the actuator 224 is therefore designed to subject the optical element 216 and the reaction mass 220 to a force $F_O$ (force on the optical element 216) and respectively force $F_R$ (reaction force on the reaction mass 220) in the x-direction. The forces $F_O$ and $F_R$ are of identical magnitude in this case.

The second elastic element 222 likewise connects the reaction mass 220, in particular directly (i.e. without interposition of further components between the reaction mass 220 and the carrying element 206, as shown in FIG. 2), to the carrying element 206, in particular to the vertical section 212 thereof. The explanations concerning the first elastic element 218 are correspondingly applicable with regard to the second elastic element 222.

The reaction mass 220 is mounted movably in the x-direction via a bearing 228. In this respect, too, there is the possibility of mounting in other degrees of freedom, as explained above. The bearing 228 can be embodied in a frictionless manner, in particular as an aerostatic bearing.

Furthermore, FIG. 2 shows a first and second damping element 230, 232, which illustrate for example an inherent damping in the elastic elements 218, 222. In this case, the first damping element 230 connects the optical element 216 to the carrying element 206, in particular to the vertical section 210. The second damping element 232 connects the reaction mass 220 to the carrying element 206, in particular to the vertical section 212 thereof.

Furthermore, the system 200 includes a sensor 234, which operates inductively or optically, for example, and detects a position $x_1(t)$, a velocity $x_1'(t)$ and/or an acceleration $x_1''(t)$ of the optical element 216.

Furthermore, the system 200 or the lithography apparatus 100 includes a control device 236, which drives the actuator 224 for example depending on the signal detected by the sensor 234 or depending on some other parameter or signal (for example a measured image distortion, a measured focus error and/or a measured overlay offset) in order to adjust the position $x_1(t)$ of the optical element 216. For this purpose, the actuator 224 applies the force $F_O$ to the optical element 216, and the reaction force $F_M$ correspondingly acts on the reaction mass 220. As a result, the optical element 216 and the reaction mass 220 are caused to vibrate. However, this vibration is not intended to be transmitted to the components of the lithography apparatus 100 that surround the carrying element 206 in particular is not intended to be transmitted to the system frame 204. This can then be achieved as follows: the forces $F_{k1}$, $F_{k2}$ exerted on the carrying element 206 by the elastic elements 218, 222 and the forces $F_{c1}$, $F_{c2}$ exerted on the carrying element 206 by the damping elements 230, 232 are provided in such a way that a resulting force $F_R$ on the carrying element 206 is substantially equal to zero or is equal to zero. This should be regarded as fulfilled in the present case if the resulting force $F_R$ is a maximum of one tenth, one hundredth or one thousandth of the actuation force $F_O$. This can be achieved by virtue of a mass $m_1$ of the optical element 216, a mass $m_2$ of the reaction mass 220, a stiffness $k_1$ of the first elastic element 218, a stiffness $k_2$ of the second elastic element 222, a damping $c_1$ of the first damping element 230 and a damping $c_2$ of the second damping element 232 being correspondingly selected or adapted.

Given negligible damping $c_1$, $c_2$, the fact that the resulting force $F_R$ is equal to zero can be achieved by virtue of the masses $m_1$, $m_2$ and stiffnesses $k_1$, $k_2$ being chosen in such a way that the following holds true:

$$\frac{m_1}{m_2} = \frac{k_1}{k_2} \tag{1}$$

This should also be regarded as fulfilled in the present case if the formula only approximately holds true. For example, the quotient $$\frac{m_1 k_2}{m_2 k_1}$$

can be between 0.8 and 1.2, preferably between 0.9 and 1.1, more preferably between 0.95 and 1.05, even more preferably between 0.99 and 1.01 and even more preferably between 0.999 and 1.001.

The abovementioned formula (1) can be derived as follows:

The following holds true for the optical element 216:

$$F_O = m_1 x_1''(t) + c_1 x_1'(t) + k_1 x_1(t) \tag{2}$$

The following holds true for the resonance mass 220:

$$F_M = m_2 x_2''(t) c_2 x_2'(t) + k_2 x_2(t) \tag{3}$$

Furthermore, the following holds true for the forces generated by the actuator 224:

$$F_O + F_M = 0 \tag{4}$$

Moreover, the following holds true for the forces $F_{k1}$, $F_{k2}$, $F_{c1}$ and $F_{c2}$ (since the reaction force $F_R$ is intended to be equal to zero):

$$F_{k1} + F_{c1} + F_{k2} + F_{c2} = 0 \tag{5}$$

The following furthermore hold true for the stated forces:

$$F_{k1} = k_1 x_1(t) \tag{6}$$

$$F_{c1} = c_1 x_1'(t) \tag{7}$$

$$F_{k2} = -k_2 x_2(t) \quad (8)$$

$$F_{c2} = -c_2 x_2'(t) \quad (9)$$

If formulae (6)-(9) are then inserted into formula (5) and the Laplace theorem is applied thereto, and if the Laplace theorem is likewise applied to formulae (2) and (3) and the latter are inserted into the abovementioned result formula, then—disregarding the damping $c_1$, $c_2$—the following is obtained:

$$k_1 \left( \frac{1}{m_1 s^2 + k_1} \cdot F_O \right) - k_2 \left( \frac{1}{m_2 s^2 + k_2} \cdot F_O \right) = 0$$

This results in the following:

$$\frac{m_1}{m_2} = \frac{k_1}{k_2}$$

In other words, the natural frequencies of the optical element 216 and of the reaction mass 220, which can be expressed as:

$$f_i = \frac{1}{2\Pi} \sqrt{\frac{k_i}{m_i}} \quad (12)$$

are brought to correspondence, wherein i is an integer and denotes a respective single-mass vibrator.

This advantageously has the result that the stiffnesses $k_1$, $k_2$ of the elastic elements 218, 222 no longer have to be provided as very low, that is to say very soft. This is because the forces $F_{k1}$, $F_{k2}$ simply cancel one another out. By way of example, the following can hold true:

$$\frac{\sqrt{\frac{k_1}{m_1}}}{2\pi} = \frac{\sqrt{\frac{k_2}{m_2}}}{2\pi} \geq 5 \text{ Hz}. \quad (13)$$

Consequently, shorter elastic elements 218, 222 can also be used, with the result that a saving of structural space is obtained. Moreover, it is thus also possible to use elastic elements 218, 222 which have a high lateral stiffness (in the y- and z-directions) and thus guide the movement of the optical element 216 and respectively of the reaction mass 220 well. Moreover, a higher stiffness $k_1$, $k_2$ also means shorter spring excursions, which has a positive effect on the lifetime of such spring elements.

If the damping $c_1$, $c_2$ is not disregarded, then the following results as solution to equation (5):

$$\frac{m_1}{m_2} = \frac{k_1}{k_2} = \frac{c_1}{c_2} \quad (14)$$

FIG. 3 shows a vibration-compensated optical system 200 in accordance with a further embodiment.

In contrast to FIG. 2, the carrying element 206 together with assigned components is rotated by 90 degrees, such that the optical element 216 and also the reaction mass 220 move in the z-direction, that is to say in and counter to the gravitational force, upon an actuation by the actuator 224.

Although the gravitational force brings about an altered rest position of the optical element 216 and of the reaction mass 220, it remains unimportant from a dynamic standpoint, such that additionally given appropriate choice of the masses, stiffnesses and dampings, as described above, the force compensation striven for is achieved, or a resulting reaction force $F_R$ on the carrying element 206 is equal or approximately equal to zero.

FIG. 4 shows a vibration-compensated optical system 200 in accordance with a further embodiment.

In contrast to FIG. 2, the masses $m_1$, $m'_2$ are mounted movably in the z-direction. In addition, provision is made of two actuators 224 with assigned reaction masses 220 and second elastic elements 222 assigned in turn thereto. Furthermore, the optical element 216 is supported via two first elastic elements 218 on the carrying element 206, in particular directly. A pivoting of the optical element 216 about the y-axis and a translational movement along the z-direction can be realized via the two actuators 224.

In order here, too, to provide a resulting reaction force $F_R$, particularly in the case of pivoting about the y-axis, on the carrying element 206 that is equal or approximately equal to zero, the following can hold true for the masses $m_1$, $m'_2$ and stiffnesses $k_{1'}$, $k_{2'}$:

$$\frac{m_1}{m'_2} = \frac{k'_1}{k'_2} \quad (15)$$

Figure 5:
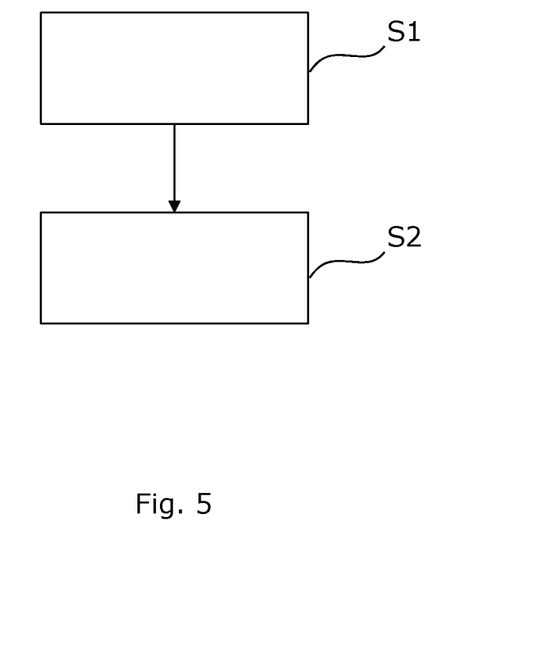
FIG. 5 shows a method for producing a vibration-compensated optical system in accordance with one embodiment.

FIG. 5 then illustrates a method for producing a vibration-compensated optical system 200.

In this method, in a step S1 (hereafter referring to the exemplary embodiment according to FIG. 2, but equally applicable to the exemplary embodiments according to FIG. 3 or FIG. 4), three of the four parameters $m_1$, $m_2$, $k_1$, $k_2$ are selected. The mass $m_1$ and the stiffnesses $k_1$, $k_2$ are preferably selected because they are fixed in a manner governed by the system (e.g. the mass $m_1$) or are available as standard components (elastic elements 218, 222). The mass $m_2$ of the reaction mass 220 is subsequently adapted in a step S2 until the following holds true:

$$\frac{m_1}{m_2} = \frac{k_1}{k_2}$$

Adapting the mass can be carried out for example by surface processing of the reaction mass via etching or lasering.

In accordance with a further embodiment, by way of example, the masses $m_1$, $m_2$ and the spring stiffness $k_1$ can be determined, which can be carried out for example by selecting corresponding components. The stiffness $k_2$ of the second elastic element 222 is subsequently adapted, for example by surface processing thereof, in particular by etching or lasering, until the following holds true:

$$\frac{m_1}{m_2} = \frac{k_1}{k_2}$$

Although the disclosure has been explained on the basis of various exemplary embodiments in the present case, it can be modified in diverse ways.

LIST OF REFERENCE SIGNS 100 lithography apparatus
102 beam shaping system
104 illumination system
106 projection system
108 light source
110 collimator
112 monochromator
114 radiation
116 first mirror
118 second mirror
120 photomask
122 wafer
124 third mirror
126 fourth mirror
200 vibration-compensated optical system
202 elastic element
204 system frame
206 carrying element
208 horizontal section
210 vertical section
212 vertical section
214 pocket
216 optical element
218 first elastic element
220 reaction mass
222 second elastic element
224 actuator
226 bearing
228 bearing
230 first damping element
232 second damping element
234 sensor
236 control device
$c_1$ damping
$c_2$ damping
$F_{k1}$ force
$F_{k2}$ force
$F_{c1}$ force
$F_{c2}$ force
$F_R$ resulting force
$F_M$ force on reaction mass
$F_O$ force on optical element
$k_1$ stiffness
$k'_1$ stiffness
$k_2$ stiffness
$m_1$ mass
$m_2$ mass
$m'_2$ mass
x spatial direction
$x_1(t)$ position in x-direction as a function of time
$x_2(t)$ position in x-direction as a function of time
y spatial direction
z spatial direction

What is claimed is:

1. A system, comprising:
   an optical element;
   a carrying element;
   an actuator configured to actuate the optical element relative to the carrying element;
   a first elastic element directly coupling the optical element to the carrying element;
   a reaction mass coupled to the optical element via the actuator; and
   a second elastic element directly coupling the reaction mass to the carrying element, wherein:
   $m_1$ is a mass of the optical element, $k_1$ is a stiffness of the first elastic element;
   $m_2$ is a mass of the reaction mass;
   $k_2$ is a stiffness of the second elastic element;
   the system further comprises:
      a first damping element coupling the optical element to the carrying element; and
      a second damping element coupling the reaction mass to the carrying element
   the first damping element has a damping ($c_1$);
   the second damping element has a damping ($c_2$); and $$\frac{m_1}{m_2} = \frac{k_1}{k_2} = \frac{c_1}{c_2}.$$

2. The system of claim 1, wherein a ratio $$\frac{m_1 k_2}{m_2 k_1}$$

is between 0.8 and 1.2.

3. The system of claim 1, wherein $$\frac{\sqrt{\frac{k_1}{m_1}}}{2\pi} = \frac{\sqrt{\frac{k_2}{m_2}}}{2\pi} \geq 5 \text{ Hz.}$$

4. The system of claim 1, wherein at least one parameter is adaptable during operation of the system, and the at least one parameter is selected from the group consisting of the mass of the optical element, the stiffness of the first elastic element, the damping of the first damping element, the mass of the reaction mass, the stiffness of the second elastic element, and the damping of the second damping element.

5. The system of claim 1, wherein the system is configured so that, when the actuator actuates the optical element relative to the carrying element, a force on the carrying element resulting from the actuation is zero.

6. The system of claim 1, wherein at least one element selected from the group consisting of the first elastic element and the second elastic element is selected from the group consisting of a bending spring and a torsion spring.

7. The system of claim 1, wherein at least one element selected from the group consisting of the first elastic element and the second elastic element is monolithic.

8. The system of claim 1, wherein the actuator is configured to generate oppositely oriented forces of identical magnitude that act on the optical element and the carrying element.

9. The system of claim 1, wherein the actuator is configured to couple the optical element and the reaction mass to each other in a contactless manner.

10. The system of claim 1, wherein the actuator comprises a Lorentz force motor.

11. The system of claim 1, further comprising:
   a sensor configured to detect a position of the optical element relative to the carrying element; and
   a control device configured to control the actuator depending on the detected position.

12. The system of claim 1, wherein the optical element comprises at least one member selected from the group consisting of a mirror and a lens.

13. The system of claim 1, wherein the system is configured so that, when the actuator actuates the optical element relative to the carrying element, a force on the carrying element resulting from the actuation is zero.

14. An apparatus, comprising:
a first system comprising the system of claim 1, wherein the apparatus comprises a lithography apparatus.

15. The apparatus of claim 14, further comprising a second system selected from the group of a lithography beam shaping system, a lithography illumination system, a lithography projection system, and a lithography photomask, wherein the second system comprises the first system.

16. The system of claim 1, wherein at least one of the following holds:
the reaction mass is surface-processed to adapt its mass;
the optical element is surface-processed to adapt its mass;
the first elastic element is surface-processed to adapt its stiffness; and
the second elastic element is surface-processed to adapt its stiffness.

17. The system of claim 16, wherein the surface-processed surface is an etched surface or a lasered surface.

18. A system, comprising:
an optical element;
a carrying element;
an actuator configured to actuate the optical element relative to the carrying element;
a first elastic element directly coupling the optical element to the carrying element;
a reaction mass coupled to the optical element via the actuator; and
a second elastic element directly coupling the reaction mass to the carrying element,
wherein the system is configured so that, when the actuator actuates the optical element relative to the carrying element, a force on the carrying element resulting from the actuation is zero,
wherein the system further comprises:
a first damping element coupling the optical element to the carrying element; and
a second damping element coupling the reaction mass to the carrying element, and
wherein the system is configured so that a mass of the optical element, a stiffness of the first elastic element, a damping of the first damping element, a mass of the reaction mass, a stiffness of the second elastic element, and a damping of the second damping element are such that, when the actuator actuates the optical element relative to the carrying element, a force on the carrying element resulting from the actuation is zero.

19. An apparatus, comprising:
a first system comprising the system of claim 18, wherein the apparatus comprises a lithography apparatus.

20. The apparatus of claim 19, further comprising a second system selected from the group of a lithography beam shaping system, a lithography illumination system, a lithography projection system, and a lithography photomask, wherein the second system comprises the first system.

* * * * *

UNITED STATES PATENT AND TRADEMARK OFFICE
CERTIFICATE OF CORRECTION

PATENT NO. : 10,095,120 B2
APPLICATION NO. : 15/236602
DATED : October 9, 2018
INVENTOR(S) : Yim-Bun Patrick Kwan and Tim Groothuijsen It is certified that error appears in the above-identified patent and that said Letters Patent is hereby corrected as shown below:

In the Specification

Column 6, Line 17, delete "katadioptric" and insert -- catadioptric --.

Column 8, Line 43, delete "true" and insert -- true: --.

Signed and Sealed this
Second Day of April, 2019

Andrei Iancu
*Director of the United States Patent and Trademark Office*